United States Patent [19]

Hulseweh et al.

[11] Patent Number: 4,583,282

[45] Date of Patent: Apr. 22, 1986

[54] PROCESS FOR SELF-ALIGNED BURIED LAYER, FIELD GUARD, AND ISOLATION

[75] Inventors: Terry S. Hulseweh; Carroll Casteel, both of Mesa, Ariz.

[73] Assignee: Motorola, Inc., Schaumburg, Ill.

[21] Appl. No.: 650,969

[22] Filed: Sep. 14, 1984

[51] Int. Cl.$^4$ .............. H01L 21/80; H01L 21/76
[52] U.S. Cl. .................. 29/576 W; 29/576 B; 29/576 E; 29/578; 29/576 T; 148/1.5; 148/175; 148/DIG. 85; 148/DIG. 117; 148/DIG. 125; 148/DIG. 128
[58] Field of Search .......... 29/576 W, 576 B, 576 E, 29/578, 576 T; 148/1.5, 175, DIG. 85, DIG. 117, DIG. 125, DIG. 128; 357/49

[56] References Cited

U.S. PATENT DOCUMENTS

| | | | |
|---|---|---|---|
| 3,500,139 | 3/1970 | Frouin et al. | 317/235 |
| 3,648,128 | 3/1972 | Kobayashi | 317/235 R |
| 3,825,450 | 7/1974 | Schoeff | 148/175 |
| 3,825,451 | 7/1974 | Schoeff | 148/175 |
| 3,947,299 | 3/1976 | Weijland et al. | 148/175 |
| 4,135,954 | 1/1979 | Chang et al. | 148/187 |
| 4,160,991 | 7/1979 | Anantha et al. | 357/49 |
| 4,169,000 | 9/1979 | Riseman | 29/576 W |
| 4,199,380 | 4/1980 | Farrell et al. | 148/1.5 |
| 4,242,791 | 1/1981 | Horng et al. | 29/578 |
| 4,252,582 | 2/1981 | Anantha et al. | 148/175 |
| 4,255,207 | 3/1981 | Nicolay et al. | 148/174 |
| 4,272,776 | 6/1981 | Weijland et al. | 357/50 |
| 4,318,751 | 3/1982 | Horng | 148/1.5 |
| 4,333,794 | 6/1982 | Beyer et al. | 156/648 |
| 4,356,211 | 10/1982 | Riseman | 427/85 |
| 4,369,565 | 1/1983 | Muramatsu | 29/580 |
| 4,373,965 | 2/1983 | Smigelski | 148/1.5 |
| 4,376,336 | 3/1983 | Endo et al. | 29/571 |
| 4,378,627 | 4/1983 | Jambotkar | 29/571 |
| 4,381,953 | 5/1983 | Ho et al. | 148/1.5 |
| 4,381,956 | 5/1983 | Lane | 148/175 |
| 4,389,281 | 6/1983 | Anantha et al. | 156/646 |
| 4,404,735 | 9/1983 | Sakurai | 29/576 W |
| 4,449,287 | 5/1984 | Maas et al. | 29/580 |
| 4,449,935 | 4/1984 | Zamba et al. | 26/622 |
| 4,454,646 | 6/1984 | Joy et al. | 29/576 W |
| 4,454,647 | 6/1984 | Joy et al. | 29/576 W |
| 4,462,847 | 7/1984 | Thompson et al. | 29/576 W |
| 4,463,493 | 8/1984 | Momose | 29/576 B |

FOREIGN PATENT DOCUMENTS

| | | | |
|---|---|---|---|
| 63841 | 4/1982 | Japan | 29/576 W |
| 123737 | 7/1983 | Japan | 29/576 W |
| 112489 | 4/1984 | Japan | . |
| 2346 | 7/1984 | Japan | 29/576 W |

Primary Examiner—Brian E. Hearn
Assistant Examiner—Hunter L. Auyang
Attorney, Agent, or Firm—Robert M. Handy

[57] ABSTRACT

A process is described for producing isolated semiconductor devices in a common substrate which have self-aligned and pre-located isolation walls, buried layers, and channel-stops. The isolation walls are formed from a stacked arrangement of a dielectric region and a polycrystalline semiconductor region, above a doped channel-stop region which acts as a field guard. A single mask layer determines the location and spacing of the buried portions of the isolation walls, the channel-stops, and the buried layers.

15 Claims, 12 Drawing Figures

PROCESS FOR SELF-ALIGNED BURIED LAYER, FIELD GUARD, AND ISOLATION

BACKGROUND OF THE INVENTION

1. Field of the Invention

This invention relates in general to methods for providing electrical isolation between devices fabricated in the same semiconductor substrate and, more particularly, to improved methods for isolating adjacent devices in integrated circuits.

2. Background Art

It is commonplace in semiconductor device and integrated circuit technology to provide some means of controlling electrical coupling between devices in the same semiconductor substrate. Where the circuit design calls for the devices to have minimal coupling, a variety of means are used to provide electrical isolation, for example, dielectric isolation, junction isolation, and combinations thereof. The utility of a particular isolation scheme is a complex function of both the structural arrangement and the method of fabrication. These factors interact to affect the performance, ease of manufacture, reliability, manufacturing yield, and cost of production of the resulting devices.

Historically, junction isolation has been the most widely used technique for integrated circuits. With this approach, diffused regions extend from the surface of the semiconductor wafer through various active device layers to the underlying semiconductor substrate so as to form a P-N junction tub surrounding each of the isolated devices. Junction isolation suffers from a number of disadvantages which are well-known in the art.

More recently, it has become common to utilize dielectric regions rather than diffused regions as isolation walls. These dielectric regions or walls penetrate from the surface and separate the adjacent device regions. In order to obtain such dielectric isolation walls, a trench is etched in the semiconductor surface and then re-filled with a dielectric material, typically silicon dioxide. The dielectric filler is either grown in place from the semiconductor material itself, or deposited from an external source.

However, prior art dielectric isolation techniques and fabrication methods suffer from one or more disadvantages, such as for example, process complexity, high cost, incomplete isolation, lower manufacturing yield, poorer reliability, excessive die area consumption, and generation of excess material defects during manufacturing. Thus, a need continues to exist for isolation means and methods for semiconductor devices and integrated circuits which overcome or avoid one or more limitations of the prior art.

Accordingly, it is an object of the present invention to provide improved means and methods for electrical isolation of devices in a common semiconductor substrate, particularly for integrated circuits.

It is an additional object of the present invention to provide an improved manufacturing method for electrical isolation of adjacent devices which includes automatic self-alignment of buried layer regions, isolation regions, and channel-stop regions.

It is a further object of the present invention to provide an improved manufacturing method for electrical isolation of semiconductor devices which reduces defect generation during device manufacture.

It is an additional object of the present invention to provide an improved method for creating electrical isolation regions in semiconductor devices which incorporates an absorption sink for gettering heavy metals from critical device regions.

It is a further object of the present invention to provide an improved manufacturing method for fabricating electrically isolated semiconductor devices wherein the lateral separation between buried layer regions and channel-stop regions can be readily and conveniently controlled.

It is an additional object of the present invention to provide an improved manufacturing method for isolating semiconductor devices in a common substrate utilizing an isolation wall composed of a combination of superposed dielectric isolation and polycrystalline semiconductor regions.

It is a further object of the present invention to provide an improved manufacturing method for isolating semiconductor devices in a common substrate wherein the location and spacing of isolation walls, buried layer, and channel-stop regions is determined by a single masking layer.

As used herein, the words "polycrystalline" or "poly" are intended to include all non-single crystal forms of solids. As used herein, the words "dip etching" are intended to include all forms of blanket etching or erosion, and are not intended to be limited merely to wet chemical etching.

SUMMARY OF THE INVENTION

The attainment of the foregoing and other objects and advantages is achieved through the present invention wherein there is provided a process for fabricating semiconductor devices comprising, providing a single crystal substrate of a first conductivity type, covering a first surface of the substrate with a first masking layer, opening a first pattern in the first masking layer wherein the first pattern has a first open portion located above a first portion of the substrate and a second open portion located above a second portion of the substrate, covering the first open portion with a second masking layer leaving the second open portion uncovered, rendering non-single crystal the second portion of the single crystal substrate below the second open portion, removing the second masking layer, providing a third masking layer in the second open portion, doping the first portion of the single crystal substrate to a second conductivity type, exposing the first surface of the substrate, and growing on the first surface of the substrate a semiconductor layer having a first layer portion above the non-single crystal portion of the substrate which is non-single crystal and a second layer portion which is single crystal substantially elsewhere.

Thereafter, an oxidation resistant masking layer is conveniently applied to the surface of the semiconductor layer and a third open portion provided above the first layer portion. A dielectric isolation region is formed via the third open portion extending into but, preferably, not through the non-single crystal portion of the semiconductor layer. The dielectric region has sidewalls in contact with the single crystal portion of the semiconductor layer.

It is convenient to provide the third masking layer by thermal oxidation of the exposed substrate. It is desirable to dope the non-single crystal portion of the substrate with a higher doping level of the same type as the substrate and sufficient to overcome the opposite doping of the non-single crystal portion of the semiconductor layer deposited thereon. It is further convenient to form the semiconductor layer of a material containing dopants of the second conductivity type and of a concentration such that the doping is overcome in the non-single crystal portion by opposite dopants outdiffusing from the doped non-single crystal portion of the substrate. Additionally, it is desirable to dope a portion of the substrate immediately adjacent the nonsingle crystal region to a higher level of the same type using the doped non-single crystal portion of the substrate as a dopant source.

DETAILED DESCRIPTION OF THE DRAWINGS

For purposes of explanation, the device structures illustrated herein are shown as bipolar devices having particular combinations of N and P layers. However, those of skill in the art will understand that these device structures and doped layer combinations are presented merely as an aid to understanding and are not intended to be limiting, and that other combinations of N and P layers or regions and other device types can equally well be used and fabricated according to the teachings of the present invention.

Figure 1A:
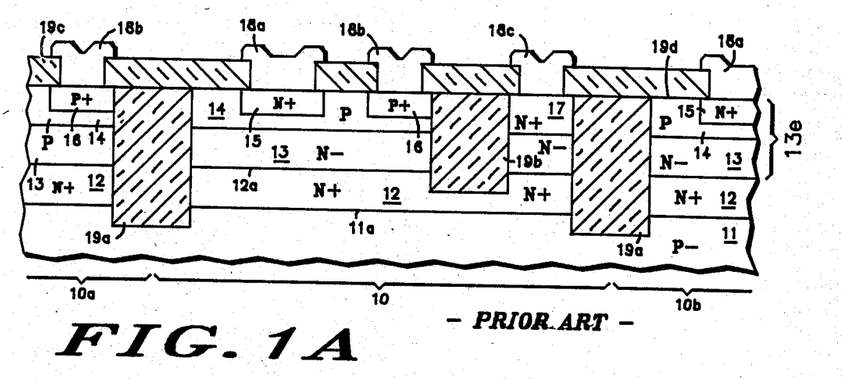
FIGS. 1A–C show simplified schematic cross-sectional views of a portion of a semiconductor device, according to the prior art, illustrating known dielectric isolation schemes.
Figure 1B:
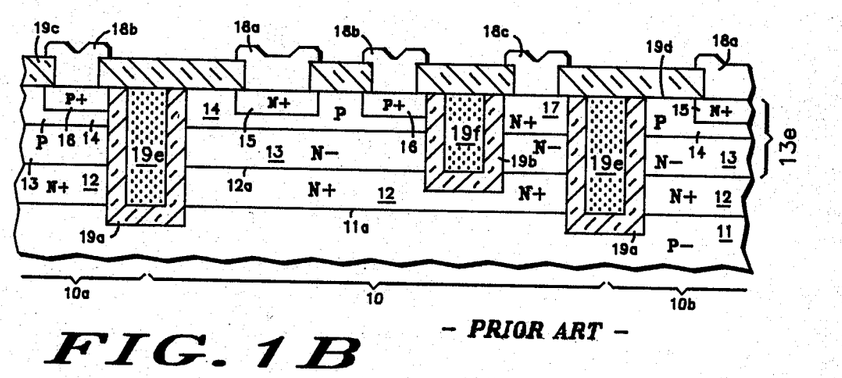
Figure 1C:
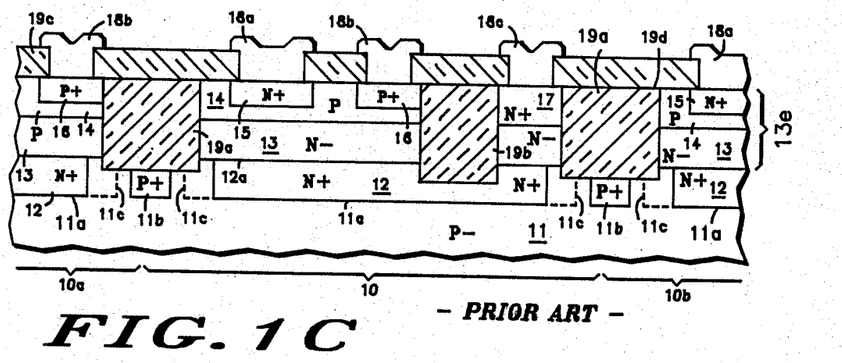

FIG. 1A–C show in schematic form simplified crossssections of portions of prior art semiconductor devices 10 and 10a–b having P− substrate 11, N+ buried layer 12, N− epitaxial region 13 which serves as the collector of bipolar devices 10 and 10a–b, P base region 14, N+ emitter 15, P+ base contact region 16, N+ collector contact region 17, emitter electrode 18a, base electrode 18b, and collector electrode 18c. In FIGS. 1A–C, deep dielectric isolation regions 19a separate device region 10 from adjacent device regions 10a–b. Dielectric regions 19a penetrate from surface 19d of device 10 into substrate 11 beneath junction 11a so as to separate buried layer regions 12, collector regions 13, and base regions 14 of adjacent devices 10, 10a, and 10b. Dielectric isolation region 19b is used to separate base region 14 from collector contact region 17. Region 19b need only extend from surface 19d of device 10 through interface 12a between N-type regions 12 and 13. Conventional dielectric layer 19c is used to passivate the surface of the devices.

The device of FIG. 1B is similar to the device of FIG. 1A except that the dielectric isolation regions consist of dielectric skins 19a–b with polycrystalline semiconductor cores 19e–f. Dielectric regions 19a–b are shown crossed hatched in FIGS. 1A–C. Polycrystalline cores 19e–f are stippled in FIG. 1B.

The device of FIG. 1C is similar to the device of FIG. 1A except that highly doped P+ regions 11b are provided beneath dielectric isolation regions 19a to act as field guards or channel-stops to reduce leakage around isolation regions 19a. Buried layers 12 may be spaced apart from isolation regions 19a, as illustrated by solid line 11a in FIG. 1C, or may intersect isolation regions 19a, as illustrated by dashed lines 11c in FIG. 1C. However, in the prior art, a separate masking and alignment step is generally required to locate buried layers 12 of FIG. 1C with respect to isolation walls 19a and channel-stops 11b.

The devices illustrated in FIGS. 1A–C suffer from a number of disadvantages. For example, deep dielectric isolation regions 19a are difficult to form, thereby increasing process complexity and cost. Further, the dielectric material has a different coefficient of expansion than the semiconductor material. As the device is heated during various manufacturing steps, the differential thermal expansion subjects the semiconductor device to substantial mechanical stress and introduces material defects which degrade both performance and reliability. The larger the volume of dielectric material, the greater the severity of this effect.

In addition, the deep isolation regions consume large amounts of device area, since the deeper the isolation region the wider it must be and the greater space which must be provided for alignment tolerance. Also, the dielectric itself frequently causes a change in conductivity in the adjacent semiconductor material so that a leakage path is formed beneath and around the dielectric isolation regions. While some of these deficiencies are ameliorated by the structures of FIGS. 1B–C, other problems are created. For example, a separate buried layer alignment and masking operation is frequently required with the structure of FIG. 1C in order to prevent N+ buried layer 12 from contacting P+ channel-stop 11b. Such contact is undesirable since it can degrade device performance and yield.

Processes for fabricating the prior art structures of FIGS. 1A–C are well-known in the art. A typical procedure consists of the following steps: (1) providing semiconductor substrate 11; (2) forming therein buried layer regions 12 by direct doping of substrate 11 generally by ion implantation or by diffusion from a doped oxide; (3) growing epitaxial layer 13e on substrate 11, adapted to contain collector regions 13, base regions 14, and emitter regions 15; (4) providing on surface 19d of epitaxial layer 13e an etch resistant masking layer having openings corresponding to isolation regions 19a; (5) etching trenches in epitaxial layer 13e reaching through to underlying substrate 11 and corresponding to the desired location of dielectric isolation regions 19a; (6) growing or depositing oxide in the trenches to form dielectric isolation regions 19a of FIG. 1A, or alternatively, growing thin oxide skins 19a as shown in FIG. 1B and depositing polycrystalline regions 19e to fill the trenches; (7) repeating the etch and refill steps to form dielectric isolation regions 19d; (8) masking surface 19d of epitaxial layer 13e and doping base regions 14; (9) masking surface 19d and providing dopant to form emitter regions 15, base contact regions 16 and collector contact regions 17; and (10) forming device contacts 18a–c through openings in surface passivation layer 19c. For the variation illustrated in FIG. 1C, channel-stop region 11b is formed beneath dielectric isolation region 19a by adding a masking and doping step prior to growing epitaxial layer 13e.

The above-described process suffers from a number of disadvantages, among which are that it yields a less than optimized isolation structure, that it requires a large number of process steps, particularly masking operations, and that it introduces an unnecessarily large concentration of material defects. These defects degrade the properties of the subsequently formed epitaxial layer in which the critical device regions will be formed.

These and other limitations and disadvantages of the prior art may be overcome with the methods and means of the present invention. FIGS. 2A–I show simplified cross-sectional views of a portion of a semiconductor device, according to the present invention, at various stages of manufacture. FIGS. 2A–I illustrate the manufacturing process as applied to a typical densely packed bipolar integrated circuit in which isolation walls are provided between adjacent, mirror image, bipolar transistors. For convenience in presenting a description of the process, a bipolar device structure is illustrated having a typical combination of N and P layers or regions. However, those of skill in the art will understand that this is merely exemplary and not intended to be limiting and that the fabrication process described herein can be applied to other semiconductor device types and other combinations of N and P layers or regions.

Figure 2A:
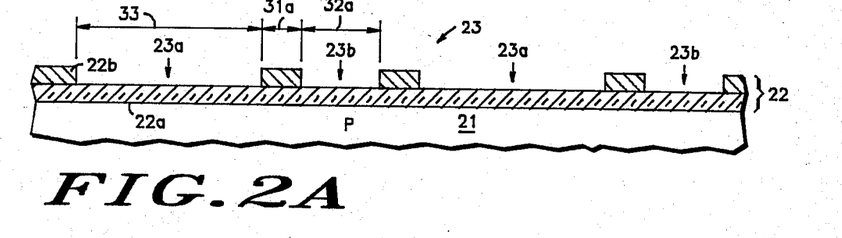
FIGS. 2A–I show simplified schematic cross-sectional views of a portion of a semiconductor device according to the present invention at different stages of fabrication.

In FIG. 2A, P type single crystal semiconductor substrate 21 is covered with masking layer 22. Masking layer 22 is conveniently formed from a double layer 22a–b, where lower layer portion 22a is conveniently of silicon oxide and upper layer portion 22b is conveniently of silicon nitride. Oxide layers having thickness in the range about 0.1 to 1.0 microns and nitride layers having thickness in the range about 0.05 to 1.0 micron are useful, but other thicknesses and materials can be used. Mask pattern 23 is formed in masking layer 22, preferably in upper layer portion 22b. Mask pattern 23 has open portions 23a–b penetrating to lower portion 22a or to substrate 21 if lower portion 22a is not used.

The location, spacing, and width of openings 23a–b are important, since, as will be subsequently explained, width 32a of opening 23b substantially determines the lateral thickness of the isolation walls which will isolate the devices, width 33 of opening 23a substantially determines the width of the buried layer regions which will be formed in the substrate, and spacings 31a in masking layer 23 between openings 23a and 23b substantially determine the separations between the buried layer regions in the substrate and the channel-stop regions which are formed underneath the isolation walls.

Figure 2B:
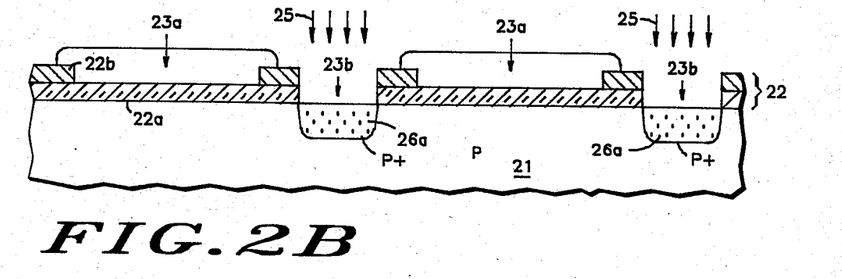

A second masking layer is applied (FIG. 2B) and patterned to give masked regions 24 covering open portions 23a. Photoresist is a suitable material for mask 24 although other materials could be used. Those parts of lower layer portion 22a exposed in openings 23b may be left in place during the subsequent steps, but the process is more conveniently carried out if they are removed. Removal is conveniently accomplished by dip etching or blanket erosion without need for any alignment steps. With masks 22 and 24 in place, portions 26a of substrate 21 underneath openings 23b are rendered non-single crystal, e.g. polycrystalline or amorphous. This is conveniently accomplished by bombarding portions 26a of substrate 21 with energetic ions 25 (FIG. 2B). However, other methods for rendering substate 21 locally non-single crystal may also be used. For purposes of this application no distinction is drawn between polycrystalline and amorphous material, either being considered to fall within the designations of non-single crystal material. The words polycrystalline or poly are used generally to refer to all forms of non-single crystal material.

Portions or regions 26a of substrate 21 may be conveniently rendered non-single crystal by bombardment with argon ions having energy in the range 40 to 200 KeV, and a dose in the range $5 \times 10^{14}$ to $1 \times 10^{16}$ ions per square cm. An energy of about 80 KeV and a dose of about $1 \times 10^{15}$ ions per square cm. is convenient when lower layer portion 22a has been removed in openings 23b. If lower layer 22a is left in place in openings 23b during bombardment, higher energies will generally be required to penetrate this layer and reach substrate 21. Those of skill in the art will understand how to adjust the bombardment energy to penetrate layer 22a, depending on its thickness and composition.

After substrate 21 has been rendered non-single crystal in portions 26a, portions 26a are doped, for example, with the same type dopant as used in substrate 21, but to a higher level. In the example of FIG. 2B, portions or regions 26a are doped P+. This is conveniently accomplished by a further ion implantation step through the same openings 23b. This implantation is conveniently carried out using B+ ions having energies in the range 40 to 200 KeV and a dose in the range $1 \times 10^{12}$ to $1 \times 10^{16}$ ions per square cm., although other doping means could also be used. An energy of 40 KeV and dose $3.5 \times 10^{13}$ B+ ions per square cm. was found to be adequate to dope regions 26a with a sufficient level of P type dopant so that it can act as a dopant source for doping regions 40 of substrate 21 immediately beneath regions 26a, and for doping polycrystalline regions 28b in layer 28 which are formed in a subsequent step. Those of skill in the art will understand that the implantations of argon and boron into substrate 21 are carried out by flooding the surface of the semiconductor wafer with the appropriate ions. Masking layers 22 and 24 protect those portions of the surface which are intended not to receive ion implantation. No additional masking layers or masking steps are required for these implantations. Layer 24 may be removed at this point by means well-known in the art.

Figure 2C:
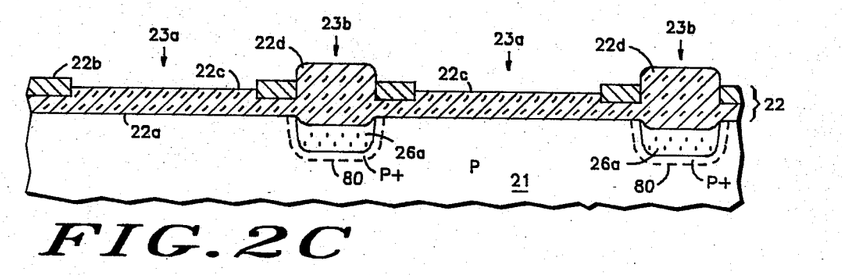

Following formation and doping of non-single crystal regions 26a, it is necessary to block off openings 23b. A conventional photoresist mask (not shown) may be used to cover openings 23b. The photoresist mask must be of sufficient thickness to protect region 26a against ions 27 to be implanted in a subsequent step. However, the alignment step necessary to place the photoresist mask over openings 23b may be avoided by the preferred method of the present invention wherein doped noncrystalline regions 26a exposed in openings 23b are partially oxidized. The doped nonsingle crystal material in region 26a oxidizes more rapidly than the single crystal material under portion 22c of layer 22a in openings 23a. Hence, thick oxide mask region 22d is formed automatically in openings 23b during the oxidation step (FIG. 2C). Meanwhile, portions 22c of oxide layer 22a exposed in openings 23a thicken by only a small amount. High pressure oxidation performed at 10 atmospheres in steam at 700° C. is suitable, but other values and means may also be used. Where mask portion 24 is of photoresist, it is conveniently removed, as noted above, prior to producing thick mask region 22d. Where mask portion 24 is of a more durable material resistant to high temperatures, it may be left in place during formation of region 22d and removed thereafter. However, this is less convenient. The elevated temperatures utilized in forming mask region 22d also conveniently serve to drive impurities from doped non-single crystal regions 26a into the immediately surrounding portions of substrate 21, so as to form doped regions 80. This locally enhances the doping of substrate 21 in regions 80 under non-single crystal regions 26a so that regions 80 act as channel-stop regions. Other heat treatments, after doping of regions 26a, and before or after formation of regions 22d may be used to form or modify doped regions 80.

Figure 2D:
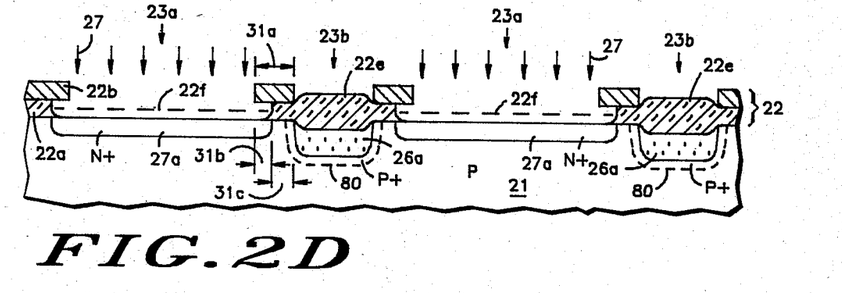

A dip etch or other uniform blanket etch or erosion process is thereafter used to remove portions 22c of layer 22a in openings 23a (FIG. 2D). Where layer 22 is a double layer, it is convenient to use an etching method which attacks layer 22a but not layer 22b. It is desirable that the surface of substrate 21 in openings 23a be covered by a thin oxide layer, as indicated by dashed line 22f in FIG. 2D, during subsequent ion implantation. An oxide thickness of 0.01 to 0.04 microns is useful with 0.02 microns being convenient. This may be obtained by etching portions 22c of oxide layer 22a to the desired thickness or by removing portions 22c completely and regrowing a fresh oxide layer of the desired thickness at 22f. Portions 22e of thick oxide region 22d remain behind to protect regions 26a during formation of buried layers 27a.

Buried layers 27a are conveniently formed by implanting dopant ions 27 in FIG. 2D. Where it is desired to form NPN bipolar transistors on a P type substrate, buried layers 27a are generally made N type, as is indicated by way of example in FIG. 2D. While other well-known methods may be used to dope substrate 21 to produce buried layers 27a, a blanket ion implantation of As ions having energies in the range 20 to 200 KeV and dose in the range $1 \times 10^{14}$ to $1 \times 10^{16}$ ions per square cm. is convenient, with 80 KeV and $5 \times 10^{15}$ ions per square cm. being typical. Other dopant materials may also be used.

Figures 2E, 2F:
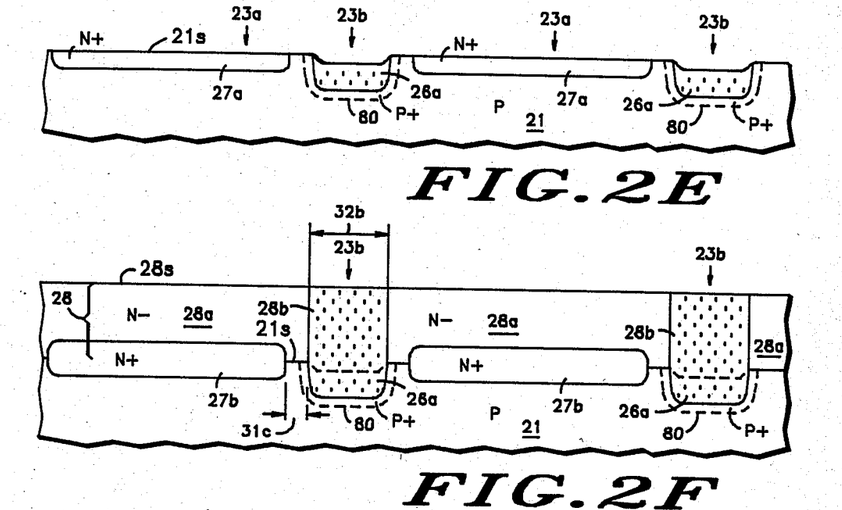

Following formation of buried layers 27a, the remaining portions of masking layer 22, including regions 22e are removed by a blanket etching or erosion process, so that upper surface 21s of subsrtrate 21, including buried layers 27a and non-single crystal regions 26a, is bare (FIG. 2E). Processes for stripping masking layers are well-known in the art. Layer 28 of semiconductor material is then formed on surface 21s (FIG. 2F). Layer 28 grows epitaxially on surface 21s and is single crystal in regions 28a above the single crystal regions 21 and 27a of substrate 21, and nonsingle crystal, e.g., polycrystalline, in regions 28b above non-single crystal regions 26a of substrate 21 (FIG. 2F). For silicon, deposition of layer 28 is conveniently carried out at 1000° C. at a pressure of 80 Torr (10.6 kPa), using di-chlorosilane as a source gas. However, other conditions generally in the range 900° to 1200° C. and 60 to 100 Torr (7.98 to 13.3 kPa) can also be used. Under these growth conditions, polycrystalline regions 28b propagate vertically more rapidly than horizontally so that regions 28b do not widen appreciably during formation of layer 28, and width 32b remains approximately constant and equal to the width of region 26a.

Because of the high mobility of dopant in nonsingle crystal material, portions 28b of layer 28 are automatically doped from regions 26a to the same type as regions 26a, even though layer 28, as deposited, may be of opposite type. For example, layer 28 for bipolar devices is generally formed by deposition lightly doped material containing dopant of the same type as buried layers 27a in order to obtain single crystal collector regions 28a (FIG. 2G) of the same type as buried layers 27a, and opposite to region 26a and substrate 21. A particular feature of the invented process is that the counter doping of regions 28b occurs automatically during formation of layer 28 and it is not necessary to deposit or form portions 28a and 28b of layer 28 separately. This reduces the number of process steps that would otherwise be required to obtain the described isolation structure. The counter doping of non-single crystal regions 28b will be virtually uniform throughout the depth of layer 28, even though at the same temperature and time, the dopant of buried layer 27a has moved only slightly upward in the crystalline portions of layer 28 to give expanded buried layers 27b.

Figure 2G:
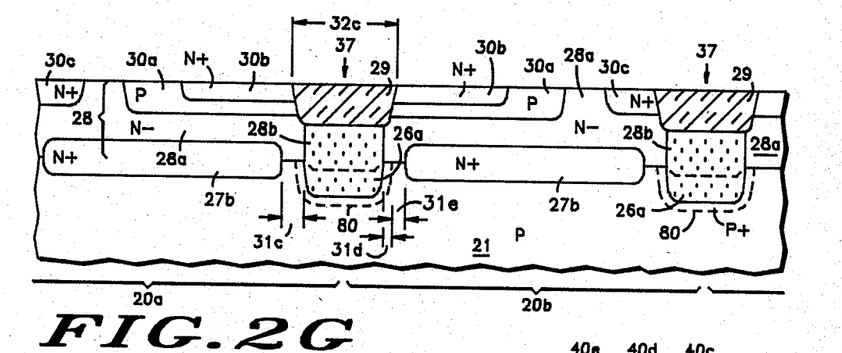

Following deposition of layer 28, a conventional masking and oxidation step is used to obtain dielectric isolation regions 29 located above non-single crystal regions 26a and penetrating into regions 28b. It is desirable that width 32c of regions 29 equal or exceed the width of poly-regions 28b, particularly when it is desired to use walled bases or emitters. A walled base or emitter is a structure where the junction between the base and collector or between the emitter and base terminates directly on the isolation wall itself. Such structures are desirable since they reduce the device area and capacitance. The depth of dielectric regions 29 must be greater than the corresponding base or emitter depth for a walled base or emitter, so that the junction intersects dielectric region 29 and not poly region 28b. Base regions 39a, emitter regions 30b, and collector contact regions 30c are formed in the surface of the isolated regions of layer 28 that are separated by isolation walls 37, using means well-known in the art (FIG. 2G). The finished devices may be protected by a passivation layer (not shown) using conventional techniques.

A particular feature of the present invention is that separation 31a between mask openings 23a-b (FIG. 1) determines the separation between buried layers 27b, isolation walls 37 and channel-stops 40. Those of skill in the art will understand that it is necessary to take into account lateral diffusion amounts 31b and 31d in choosing the original value for separation 31a between openings 23a-b in order that final separation value 31c between isolation walls 37 and buried layers 27b, and final separation value 31e between field guards or channel-stops 40 and buried layers 27b, have the desired sizes. Methods for determining the lateral spreading of doped regions are well-known in the art.

Another feature of the present invention is that width 33 of mask openings 23a determines, taking into account lateral diffusion, the width of buried layers 27b. Similarly, width 32a determines the width of polyregions 26a and 28b, and, taking into account width 32c of dielectric region 29, the width of isolation walls 37. Since openings 23a-b and separation 31a are all part of masking layer 22, the locations, sizes, and separations determined by masking layer 22 are fixed automatically self-align. This includes the device tub size and location, the buried layer size and location, the isolation wall width and location, the buried layer-isolation wall separation, the channel-stop size and location, and the separation of the buried layer and the channel-stop. While an alignment is required to lcoate dielectric region 29 above poly-region 28b, this need not be a precision alignment, as is explained below.

Another feature of the present invention is that dielectric region 29 does not spread laterally to the same extent that a region of equal depth would if fabricated according to the prior art. It is well-known that polycrystalline materials oxidize more rapidly than single crystalline materials when heavily doped. Thus, region 29 grows more rapidly vertically into poly region 28b than it does laterally into surrounding single crystal regions 28a. Thus a given depth of dielectric region 29, for example, as may be necessary to permit a walled base, is obtained with smaller lateral spreading into single crystal portions 28a of layer 28. This provides isolation walls 37 that are laterally narrower and hence occupy less device area. Further, the mask opening needed to form region 29, can be smaller than width 32a and may be somewhat misaligned, since the dielectric region will spread laterally in poly-region 28b relatively rapidly until it impinges on adjacent single crystal regions 28a. Thus, the alignment for region 29 is made easier, less precision is required, and less alignment tolerance need be provided. This conserves device area which is very important in achieving devices and circuits of improved performance, lower cost and greater density.

An advantage of the described process is that dielectric regions 29 need not extend to substrate 21, but can be substantially shallower, generally one half or less the depth of substrate 21. As a consequence, the total volume of dielectric material which must be used for isolation purposes is substantially reduced. Since dielectric materials generally have a different coefficient of expansion than semiconductor materials, it is highly advantageous to use isolation schemes which minimize the amount of dielectric material required, since this produces isolation walls which have an average coefficient of expansion more closely matching that of the semiconductor material. This reduces thermal expansion mis-match and the related defect generation in substate 21 and layer 28 during processing.

Figure 2H:
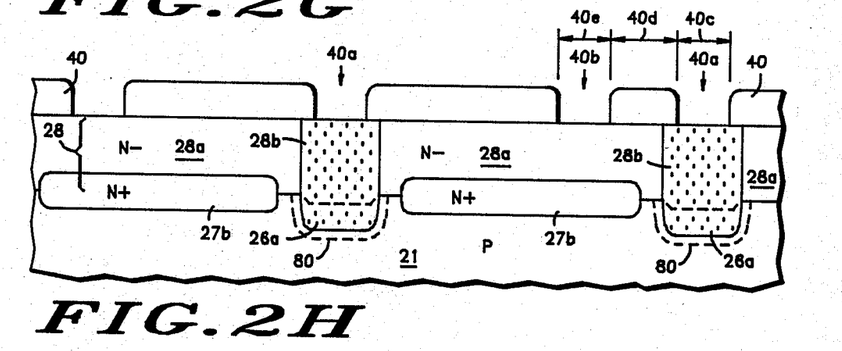
Figure 2I:
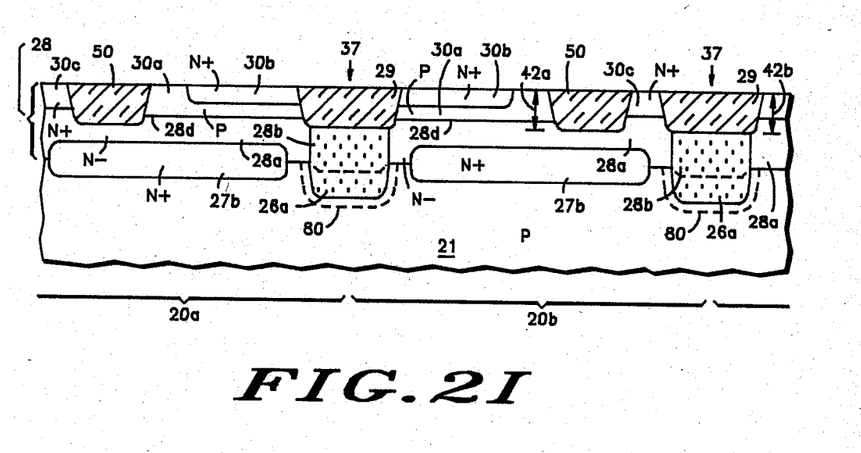

FIGS. 2H–I illustrate an alternative embodiment of the invented process wherein additional dielectric isolation regions 50 are provided to separate base regions 30a and collector contact regions 30c (FIG. 2I). This is accomplished by first covering the structure of FIG. 2F with masking layer 40 on surface 28s, wherein masking layer 40 has openings 40a–b, as in FIG. 2H. Masking layer 40 must be oxidation resistant. Silicon nitride is a suitable material. Means for forming and patterning silicon nitride masking layers are well-known in the art.

Openings 40a in layer 40 are located above polyregions 28b. Width 40c of opening 40a can be smaller than width 32b of poly-region 28b, since dielectric regions 29 formed through openings 40a will grow wider than openings 40a during oxidation of regions 28b. Opening 40a need not be precisely centered over region 28b since dielectric region 29 will grow more rapidly in non-single crystal region 28b than in adjoining single crystal regions 28a. Thus, if a first side-wall of oxide region 29, growing in region 28b, reaches a first single crystal region 28a before the other side-wall reaches the second single crystal region 28a on the opposite side of region 29, then lateral oxidation at the first side-wall will slow down in the first single crystal region, while oxidation at the second side-wall, still in the non-single crystal region, continues at the original rate until it reaches the opposite single crystal region. This provides a self-limiting action which compensates for lateral misalignment of openings 40a above regions 28b.

Openings 40b are located above single crystal regions 28a. Openings 40b determine the location of dielectric isolation walls 50 which are formed through openings 40b. Separation distance 40d determines, taking into account lateral oxidation, the separation of dielectric isolation regions 29 and 50. Depth 42a of dielectric region 50 will generally be equal or less than depth 42b of dielectric region 29. This is due to the fact that oxidation can proceed more rapidly in poly-regions 28b. Where a walled base structure is desired, as is shown in FIG. 2I, depth 42a of dielectric region 50 must be greater than the depth of basecollector junction 28d.

A particular advantage of the present invention is that only a single masking step is needed to locate and produce dielectric isolation regions 29 and 50. Mask layer 40 with self-aligned openings 40a–b locates both dielectric isolation regions 29 and 50. In the prior art configurations of FIGS. 1A–B, dielectric isolation regions 19a–b are of different depths, hence two separate masking and formation operations are required. In prior art configuration FIG. 1C, regions 19a–b have the same depth and so may be formed at the same time with a single mask. However, an additional masking step is required to produce separated buried layer regions 12 and channel-stop regions 11b in FIG. 1C, whereas in the present invention, these are aligned by a single mask. Thus, the configuration of FIG. 2I, prepared according to the method of the present invention, can be obtained with fewer masking steps than in the prior art of either FIGS. 1A–B or FIG. 1C.

Having thus described the invention, it is apparent that the present invention provides a method for constructing multiple isolated devices in a common semiconductor substrate. The described method is particularly suitable for use in integrated circuits. The invented process makes possible the use of walled base and emitter structures while minimizing the depth, lateral extent, and alignment tolerance of the isolation regions employed. It is further apparent that the invented procress provides a particularly effective and simple means for fabricating isolated device regions having improved characteristics with the same or fewer masking and alignment steps. The dimensions and locations of the buried layer, isolation wall, and channel-stop are determined by a single mask pattern.

A further advantage of the present invention is that polycrystalline region 28b which is retained in the finished device structure provides a sink for heavy metals which may have been present in layer 28 or which may have been introduced during device manufacture. It is well known that polycrystalline silicon can act as a getter for heavy metals. Region 28b is immediately adjacent the lightly doped collector regions where heavy metals may undesirably affect device characteristics. Thus, the invented process provides automatically a means for stabilizing device properties.

While the invented process has been illustrated in terms of particular combinations of conductivity and device types, those of skill in the art will recognize that these are merely intended to be illustrative, and that the invented method can be used in connection with other combinations of conductivity types and other types of devices. Accordingly, it is intended to include all such variations within the claims which follow.

We claim:

1. A process for fabricating semiconductor devices comprising:
   providing a single crystal semiconductor substrate of a first conductivity type;
   covering a first surface of said substrate with a first masking layer;
   opening a first pattern in said first masking layer, wherein said first pattern has a first open portion located above a first portion of said substrate and a second open portion located above a second portion of said substrate;

covering said first open portion with a second masking layer leaving said second open portion uncovered;

rendering non-single crystal said second portion of said single crystal substrate below said second open portion;

removing said second masking layer;

providing a third masking layer in said second open portion;

doping said first portion of said single crystal substrate to a second conductivity type;

exposing said first surface of said substrate; and growing on said first surface of semiconductor layer having a first layer portion which is non-single crystal above said non-single crystal portion of said substrate and a second layer portion which is a single crystal substantially elsewhere.

2. The process of claim 1 further comprising, after said rendering step, doping said non-single crystal portion of said substrate.

3. The process of claim 2 further comprising:

applying an oxidation resistant masking layer to said semiconductor layer having therein a third open portion exposing said first layer portion; and forming a dielectric isolation region through said third open portion extending into said first layer portion and not penetrating to said substrate.

4. The process of claim 2 wherein said step of doping said non-single crystal portion of said substrate comprises doping with a conductivity type opposite the type of said semiconductor layer and of a concentration sufficient to act as a dopant source to counter dope said non-single crystal first portion layer of said semiconductor layer.

5. The process of claim 1 wherein said first masking layer comprises a double layer having an upper layer portion and a lower layer portion and said first pattern is formed in said upper layer portion.

6. The process of claim 5 further comprising, prior to said first rendering step, removing said lower layer portion in said second open portion to expose said substrate.

7. The process of claim 5 wherein said step of doping said first portions of said substrate comprises thinning said lower layer portion in said first open portion and doping said first portion of said single crystal substrate by ion implantation.

8. The process of claim 1 wherein said second providing step comprises partially oxidizing said non-single crystal region.

9. The process of claim 1 wherein said first portion of said single crystal substrate is formed spaced from said non-single crystal portion of said substrate.

10. The process of claim 1 wherein said growing step comprises growing said first and second layer portions simultaneously.

11. A process for fabricating isolated semiconductor devices in a single crystal substrate, comprising:

providing a first dopant resistant mask on said substrate having first openings above first portions of said substrate;

bombarding said first portions of said substrate through said first opening in said first mask to render said first portions of said substrate non-single crystal;

providing a second dopant resistant mask on said substrate having second openings above second portions of said substrate;

doping said second portions of said substrate through said second opening;

removing any remaining portions of said first and second masks;

forming a semiconductor layer on said substrate wherein said semiconductor layer is non-single crystal above said first portions of said substrate and single crystal above said second portions of said substrate;

providing a dielectric isolation region in said non-single crystal portions of said semiconductor layer, not extending to said substrate; and forming said semiconductor devices in said single crystal portions of said semiconductor layer between said non-single crystal portions of said semiconductor layer.

12. A process for fabricating semiconductor devices in a single crystal substrate, comprising:

providing, on a surface of said substrate, a dopant resistant mask layer having spaced apart openings exposing spaced apart first portions of said surface of said substrate;

rendering non-single crystal said spaced apart first portions of said surface of said substrate;

removing said mask layer to expose said surface of said substrate;

forming on said surface of said substrate a semiconductor layer which has spaced apart non-single crystal regions above said spaced apart first portions of said surface of said substrate; and forming semiconductor device regions in said portion of said semiconductor layer between said spaced apart non-single crystal regions.

13. The process of claim 12 further comprising, before said preparing step, replacing a part of said spaced apart non-single crystal regions of said semiconductor layer with dielectric regions.

14. The process of claim 12 further comprising, before said first forming step, doping said spaced apart non-single crystal portions of said substrate with a first dopant.

15. The process of claim 14 further comprising prior to said first forming step, doping second portions of said surface of said substrate lying between said first spaced apart portions of said surface of said substrate with a second dopant.

* * * * *